(12) United States Patent
Dishman et al.

(10) Patent No.: US 7,759,964 B2
(45) Date of Patent: Jul. 20, 2010

(54) APPARATUS, SYSTEM, AND METHOD DETERMINING VOLTAGE, CURRENT, AND POWER IN A SWITCHING REGULATOR

(75) Inventors: Cecil C. Dishman, Raleigh, NC (US); Eino A. Lindfors, Raleigh, NC (US); Randhir S. Malik, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 11/970,779

(22) Filed: Jan. 8, 2008

(65) Prior Publication Data

US 2009/0174393 A1    Jul. 9, 2009

(51) Int. Cl.
G01R 31/36 (2006.01)
(52) U.S. Cl. ...................................... 324/771
(58) Field of Classification Search ................... 324/771
See application file for complete search history.

(56) References Cited

U.S. PATENT DOCUMENTS

| | | | |
|---|---|---|---|
| 1,657,262 A | 1/1928 | Karapetoff | |
| 3,543,153 A | 11/1970 | Genuit | 324/102 |
| 3,995,210 A | 11/1976 | Milkovic | 323/94 |
| 4,583,073 A | 4/1986 | Stolowicki | 340/310 |
| 5,206,600 A | 4/1993 | Moehlmann | 324/650 |
| 5,502,610 A | 3/1996 | Chaney | 361/18 |

*Primary Examiner*—Ha Tran T Nguyen
*Assistant Examiner*—Roberto Velez
(74) *Attorney, Agent, or Firm*—Kunzler Needham Massey & Thorpe

(57) ABSTRACT

An apparatus, system, and method are disclosed for measuring voltage, current, and power in a power supply. The apparatus consists of a voltage measuring module which measures the peak voltage through an inductor in a switching power supply stage of the power supply for a portion of the switching period. A current measuring module measures the peak current in the switching power supply stage for a portion of the switching period. The measured currents and voltages are proportional to the voltage and current at a point in the power supply where a power measurement is desired. The voltage and current values are multiplied along with a constant to provide an accurate measure of the power at a point in the power supply. The constant generally includes a combination of a calibration constant, an RMS conversion factor, a voltage conversion factor, and a current conversion factor.

20 Claims, 6 Drawing Sheets

APPARATUS, SYSTEM, AND METHOD DETERMINING VOLTAGE, CURRENT, AND POWER IN A SWITCHING REGULATOR

BACKGROUND OF THE INVENTION

1. Field of the Invention

This invention relates to power supplies and more particularly relates to measuring voltage, current, and power in a power supply comprising a switching power stage.

2. Description of the Related Art

Electronics are ubiquitous in the present age. And for each electronic device, there is some corresponding power supply that provides the necessary energy to operate the device. These power supplies may be external (such as a power brick for a stereo), internal (as is often the case for desktop computers), or some combination thereof (laptops). The power supply typically has the responsibility of providing one or more tightly regulated output voltages and/or currents for use by the various components that make up the device. For example, a typical computer power supply will provide +3.3V, +5V, +12V, and −12V buses. The power supply maintains these values even when the load represented by the various components changes.

Many of these electronic devices plug into a standard alternating current (AC) wall outlet and the power supply converts the AC input into the appropriate direct current (DC) outputs. The conversion of the AC input to the appropriate DC output typically involves putting the input signal through a number of stages, such as a rectification stage, pre-regulation stage (for example, active harmonic filtering), and various regulation stages.

Using switching power supply stages offers a number of advantages to a designer. Those of skill in the art recognize that switching power supply stages (such as boost converters, buck converters, and related topologies) can be used to provide active power factor correction by controlling the input current of the load so that it is proportional to the input voltage. In this manner, active power factor correction can provide a power factor close to unity, thus reducing energy losses and harmonics in the system. Switching power supply stages can also be configured to provide tightly regulated output voltages in spite of changes to the load.

Individuals using an electronic device often want to know how much power is being used by or presented to the electronic device. For example, a corporation designing a data center will want to know the power requirements for their system. While providers often give projected power requirements, actual power measurements are much more accurate and allow greater precision in generating the design. The corporate client may want to be able to monitor the power drawn from an AC line by one system in comparison to the power drawn by a competitor's system. With a large data center, if all other things are equal, the power consumption and associated cost may be the critical factor in choosing one system over another.

As a result, providers of electronics are incorporating components for providing information on actual power usage into their power supplies. However, the existing solution (shown in FIG. 1) requires the addition of complex circuitry to the power supply. For example, the present solution involves monitoring the AC line voltage and the AC line current using a Hall Effect current sensor to get the AC line voltage sample 110, the AC line current sample 112, and the corresponding input AC line voltage 114 and Input AC line Current 116. These values are converted using an analog-to digital converters (A/D) 118a and 118b and stored in registers in a primary microcontroller 130 on the primary side.

In order to provide the necessary electrical isolation, optocouplers 120a and 120b are used to transfer the voltage and current values from registers on the primary microcontroller 130 to registers R1 and R2 respectively in a secondary microcontroller 132 on the secondary side. The contents of these registers are then multiplied and stored in R3 as the power. The contents are read over an I$^2$C bus or other communication bus represented by the serial data address (SDA) line 140 and the serial clock (SCLK) 142.

While this solution does provide power information to a user, it does so at considerable cost. The addition of the microcontrollers 130 and 132, along with the various A/D converters and optocouplers increases the cost of the power supply. In addition, it introduces more complex circuitry and a corresponding increase in the likelihood of failure of at least the power reading module shown in FIG. 1.

SUMMARY OF THE INVENTION

From the foregoing discussion, it should be apparent that a need exists for an improved apparatus, system, and method for measuring voltage, current and power in a power supply. Beneficially, such an apparatus, system, and method would be far simpler than the solution shown in FIG. 1 resulting in a cheaper, more reliable approach.

The present invention has been developed in response to the present state of the art, and in particular, in response to the problems and needs in the art that have not yet been fully solved by currently available apparatus, systems, and methods for measuring voltage, current, and power in a power supply. Accordingly, the present invention has been developed to provide an apparatus, system, and method for measuring voltage, current, and power that overcome many or all of the above-discussed shortcomings in the art.

The apparatus to measure voltage, current, and power is provided with a plurality of modules configured to functionally execute the necessary steps. These modules in the described embodiments include a voltage measuring module, a current measuring module, a power measurement module, and a power monitoring module.

The apparatus, in one embodiment, comprises a switching power supply stage of a power supply that includes an inductor and a switching device. The apparatus also includes a voltage measuring module that detects a peak voltage across the inductor for at least a portion of a switching period of the switching power supply stage, where the peak voltage measured across the inductor is substantially proportional to a voltage at a power measurement point. The power measurement point is a location in the power supply where a power measurement is desired. The power measurement point may a power supply input point, an intermediate point, or a power supply output point.

The apparatus may further include a current measuring module that detects a peak current in the switching power supply stage for at least a portion of a switching period of the switching power supply stage. This peak current is substantially proportional to the current at the power measurement point. In addition, the apparatus includes a power measurement module that multiplies the peak voltage with the peak current and a constant to obtain a power measurement substantially equal to the power measurement at the power measurement point.

In one embodiment, the constant includes a combination of a calibration factor, an RMS (root-mean-square) conversion factor, a voltage conversion factor, and a current conversion factor. In addition, the voltage measuring module and current measuring module are, in one embodiment, coupled to a secondary ground that is separate from the primary ground for the switching power supply stage. This grounding provides electrical isolation from the primary side of the switching power supply stage.

Depending on the topology of the switching power supply stage, the portion of the switching period corresponds to the switching device being in either a closed or an open state.

In one embodiment, the voltage measuring module includes a secondary winding coupled with the inductor which is in series with a voltage bleed diode, where the secondary winding and voltage bleed diode are in parallel with a voltage measure capacitor. Similarly, the current measuring module may include a current transformer in series with a current bleed diode, where the current transformer and current bleed diode are in parallel with a current measure capacitor.

In one embodiment, the switching power supply stage is an active power factor correction stage in boost configuration, with an input to the power supply stage provided by an input rectifier and filter, and where the switching power supply stage provides harmonic filtering and approximately unity power factor.

The apparatus may also include an analog-to-digital converter that receives a power value from the power measurement module and provides a digital power value to a power-monitoring module. In addition, the current measuring module may be positioned in series with the switching device.

A system of the present invention is also presented to measure input current, voltage, and power. In one embodiment, the system includes one or more power supplies, an electronic device that includes the varying load to the one or more power supplies, and a regulated bus being connected between the electronic device and the one or more power supplies, wherein the regulated bus delivers power from the one or more power supplies to the electrical device.

In the system, at least one power supply comprises a switching power supply stage comprising an inductor and a switching device, a voltage measuring module, a current measuring module, a power measuring module as described above. In one embodiment, the system further comprises a power monitoring module that receives the digital power value from the power measurement module and provides the digital power value to a user.

As described above, the voltage measuring module and current measuring module may be coupled to a secondary ground separate from a primary ground for the switching power supply stage, providing electrical isolation from a primary side of the switching power supply stage. In addition, the electronic device may be a personal computer, a laptop computer, and a server.

A method of the present invention is also presented for measuring voltage, current and power. The method in the disclosed embodiments substantially includes the steps necessary to carry out the functions presented above with respect to the operation of the described apparatus and system. In one embodiment, the method includes detecting a peak voltage across an inductor of a switching power supply stage in a power supply for at least a portion of the switching period of the switching power supply stage, where the voltage across the peak inductor is substantially proportional to a voltage at a power measurement point. This power measurement point is a location in the power supply where the power measurement is desired.

The method also includes detecting a peak current in the switching power supply stage for at least a portion of the switching period of the switching power supply stage, where the peak current is substantially proportional to a current at the power measurement point. The method also includes multiplying the peak voltage with the peak current and a constant. The result of the multiplication is a proportionate power value. The method may also include providing the proportionate power value to a user.

In a further embodiment, the method includes determining a calibration constant, which further involves measuring an actual power at the power measurement point, comparing the actual power to the proportionate power value, determining a calibration value for the constant such that the actual power is substantially equal to the proportionate power value, and providing the calibration value for multiplication with the peak voltage and the peak current.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules comprise at least memory and a processor, and may include software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. Where a module or portions of a module are implemented in software, the software portions are stored on one or more computer readable storage media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
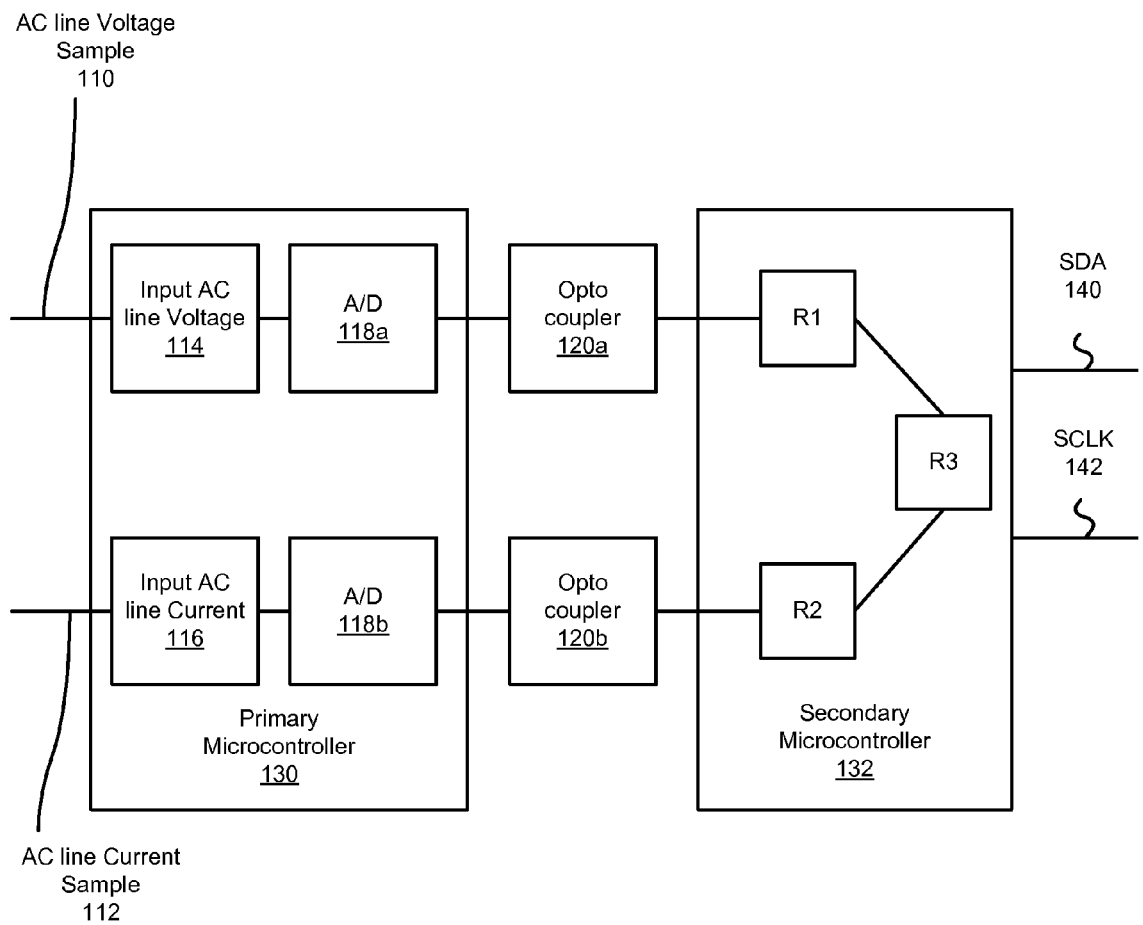
FIG. 1 is a schematic block diagram illustrating a prior art solution for measuring voltage, current and power in a power supply.
Figure 2:
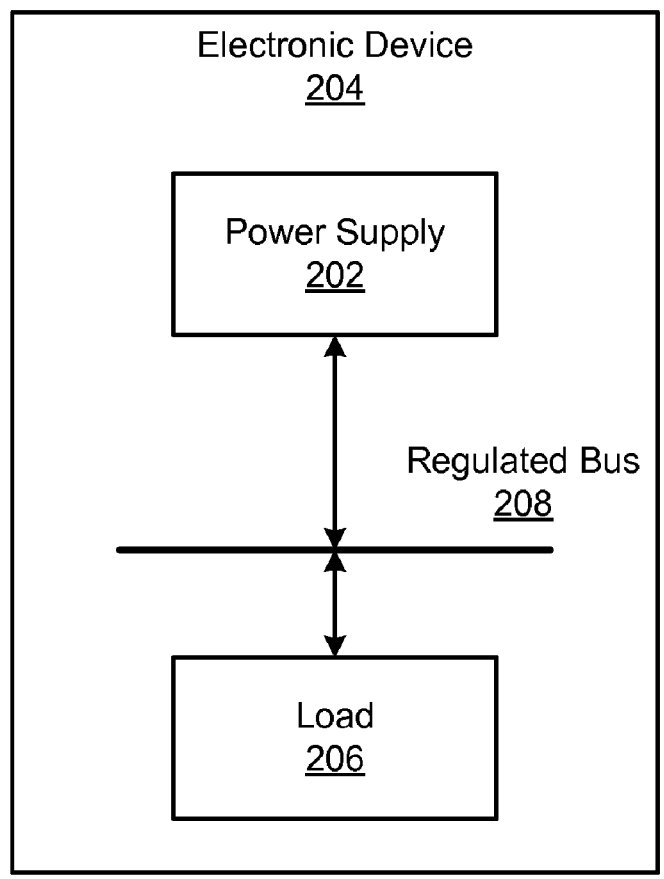
FIG. 2 is a schematic block diagram illustrating one embodiment of a system with an electronic device and associated power supply in accordance with the present invention.

FIG. 2 is a schematic block diagram illustrating one embodiment of a system 200 with a power supply 202 with an apparatus for measuring voltage, current, and power in accordance with the present invention. The system 200 includes an electronic device 204, a power supply 202, a regulated bus 208, and a load 206. The power supply 200 may also comprise circuitry described below in connection with FIGS. 3 and 4 for measuring the current, voltage, and power at a relevant point in the power supply 200.

The power supply 202 provides regulated power for various electronic systems and subsystems within the electronic device 204. The power supply 202 is typically connected to the electronic device 204 by a regulated bus 208. The regulated bus 208 and power supply 202 may be configured to provide one or more different voltages and currents to the electronic device 204. For example, as mentioned above, in a typical power supply, voltages of +12V, +5V, +3.3V, and −12V are commonly provided. While the depicted embodiment shows only a single power supply 202, many other embodiments involve multiple power supplies 202. Similarly, although the depicted embodiment shows the power supply 202 physically incorporated into the electronic device 204, the power supply 202 may be separate from the electronic device 204 and still supply the necessary power through a regulated bus 208.

In various embodiments, the electronic device 204 may be a computer system, such as a desktop, laptop, or server, and the power supply 202 may be configured to provide power to the various components of the computer system. In other embodiments, the electronic device 204 may include devices such as routers, personal digital assistants ("PDAs"), displays, or other electronic devices as recognized by one of skill in the art. In one embodiment, the power supply 202 may be implemented within the same enclosure as the electronic device 204, such as within a computer tower case. In other embodiments, the power supply 202 may be implemented external to the electronic device 204 and may be connected to the electronic device 204 via a connection means such as a cord, cable, or bus, as in a blade center.

The power supply 202 provides a regulated voltage on the regulated bus 208. The regulated bus 208 is connected between the electronic device 204 and the power supply 202. The electronic device 204 imposes a load 206 on the power supply 202. Through the regulated bus 208, the power supply 202 delivers power to the electrical device 204.

The electronic device 204 comprises a varying load 206 to the power supply 202. The amount of load 206 may affect the performance of the power supply 202. The power supply 202 is preferably configured to operate efficiently in conjunction with a specified load 206. In one embodiment, the load 206 may vary depending on the operation characteristics of the electronic device 204 and the power supply 202 may be configured to adjust accordingly. For example, the power supply 202 may include a feedback signal for adjusting the power output characteristics of the power supply 202 in response to changes in the load 206. Typically, the power supply 202 regulates the voltage on the regulated bus 208 so as to provide substantially constant voltage levels to the electronic device 204 under varying load conditions.

Figure 3:
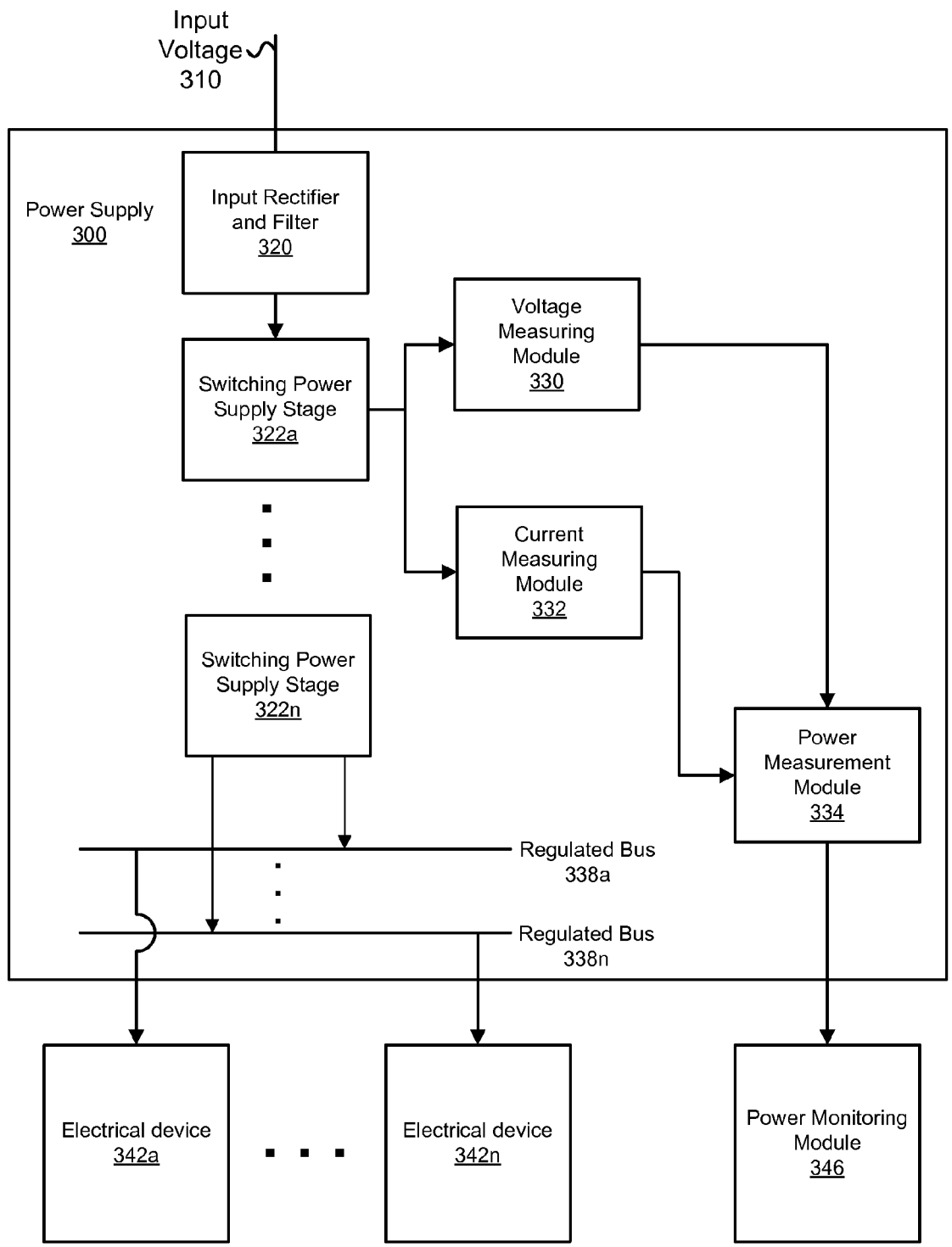
FIG. 3 is a schematic block diagram illustrating one embodiment of an apparatus for measuring voltage, current, and power in a power supply in accordance with the present invention.

FIG. 3 is a schematic block diagram of an example of a system including a power supply 300 in accordance with the present invention. The power supply 300 comprises an input rectifier and filter 320 and one or more switching power supply stages 322a-n providing a plurality of regulated buses 338a-n. The power supply 300 further comprises a voltage measuring module 330, a current measuring module 332, and a power measurement module 334.

The power supply 300 receives an input voltage 310 from a source such as a standard wall socket. The input voltage 310 may be a North American standard alternating current ("AC") input of 120V or 240V at 60 Hz. Those of skill in the art will appreciate that the voltage and frequency of the input voltage 310 may vary based on location or need without departing from the essence of the present invention. In addition, the input voltage 310 may be a DC voltage or an AC voltage coming from a variety of sources such as a bus in a computer rack system. A power supply 300 is not limited to any particular type or value of input voltage 310, so long as the power supply 300 has been built with components capable of withstanding the applied power.

The input voltage 310 is generally first put through an input rectifier and filter 320. The input rectifier and filter 320 converts the input voltage 310 from AC at its input to DC at its output. The input rectifier and filter 320 may comprise, for example, a half-wave or full-wave rectifier, the output of which is well-known to those in the art. The input rectifier and filter 320 also provides electromagnetic interference ("EMI") filtering in order to meet industry standards. Means for providing such filtering are well-known to those of skill in the art.

The power supply 300 further comprises one or more switching power supply stages 322*a-n*. Switching power supply stages 322*a-n* incorporate a switching device and a regulator that sets the switching rate. A switching power supply stage 322*a-n* is generally two DC-to-DC converters operating in parallel. A switching power supply stage 322*a* may receive the output of the input rectifier and filter 320 as its input. The input to other switching power supply stages 322*b-n* may come from earlier switching power supply stages.

Switching power supply stages 322*a-n* can provide a variety of desirable features for a power supply 300. For example, a switching power supply stage 322*a* may provide active power factor correction to provide approximately unity power factor. Switching power supply stages 322*a-n* may further be utilized to perform DC-to-DC conversions and provide tightly regulated output voltages at a regulated bus 338*a-n*. As discussed above, a plurality of switching power supply stages 322*a-n* may be used to provide a plurality of regulated buses 338*a-n* with different voltages.

The switching power supply stages 322*a-n* generally make use of feedback loops to monitor the output voltage at the associated regulated bus 338*a-n* and ensure that the proper voltage is maintained even if the load on a particular regulated bus 338*a-n* is changing. Examples of switching power supplies stages 322*a-n* include boosts, bucks, buck-boosts, flybacks, Cuks, combinations thereof, and other topologies known to those in the art. The operation of the invention in relation to a particular switching power supply stage 322*a-n* topology is given in relation to FIG. 4.

The switches in a switching power supply stage 322*a-n* are typically turned off and on by a regulator, also known as a pulse-width modulator, as discussed in greater detail in connection with FIG. 4. As a result, the switching power supply stage 322*a-n* has a switching period—the time during which the switch is on (closed), and then off (open), before turning on again. A value known as the duty cycle represents the fraction of the switching period during which the switch is in the on state. For example, a switch may be on for five nanoseconds and off for six nanoseconds. The switching period would therefore be eleven nanoseconds and the duty cycle would be (5 ns/11 ns) about 0.45.

The result of the various stages, including the switching power supply stages 322*a-n*, is one or more regulated buses 338*a-n*. As discussed above, these regulated buses 338*a-n* may provide a variety regulated voltages such as 3.3V, 5V, 12V, and −12V. The voltage on the regulated buses 338*a-n* is maintained at a constant value, with some minor fluctuation, even when the load on the regulated buses 338*a-n* changes.

Electrical devices 342*a-n* are examples of loads connected to one or more regulated buses 338*a-n*. The electrical devices 342*a-n* may be connected according to their power needs.

They may be incorporated into the same physical structure as the power supply 300, or may be physically separate.

The power supply 300 further comprises a voltage measuring module 330 configured to detect a peak voltage across an inductor in the switching power supply stage 322*a-n*. The voltage measuring module 330 does so by detecting the peak voltage across the inductor for at least a portion of the switching period of the switching power supply stage 322*a-n*. In some topologies, the voltage measuring module 330 detects the peak during the closed state, while in others, it detects the peak during the open state. An example topology is discussed in greater detail in connection with FIG. 4. This peak voltage is substantially proportional to a voltage at a particular point of interest in the power supply, referred to herein as the power measurement point. The power measurement point may be at the power supply input, an intermediate point, or a power supply output.

Similarly, the current measuring module 332 detects a peak current in the switching power supply stage for at least a portion of the switching period of the switching power supply stage 322*a-n* where the peak current is substantially proportional to the actual current at the power measurement point. Again, the portion of the switching period may refer to either the closed or open state; however, the portion over which the peak voltage and current measurements are taken will generally be the same—that is, if the relevant portion for the voltage measuring module 330 is the closed portion, the same will be true of the current measuring module 332 and vice versa.

The power supply 300 also comprises a power measurement module 334 which multiplies the peak voltage detected by the voltage measuring module 330 with the peak current detected by the current measuring module 332 and a constant. The result of the operation is a value which is substantially equal to the power measurement at the power measurement point. In one embodiment, the power measurement module is a microcontroller.

The constant may be derived from a combination of considerations. For example, it may include a calibration factor which takes into account any losses at an earlier stage (such as the input rectifier and filter 320). In addition, in typical embodiments, the voltage measuring module 330 takes only a sample of the actual voltage. For example, where the voltage measuring module 330 takes a sample voltage using additional windings over an inductor in a switching power supply stage 322*a*, the voltage measured by the windings will depend on the actual voltage, the number of additional windings, and the windings on the inductor itself. The actual voltage will be a scalar multiple of the measured voltage, and the scalar depends on the ratio of the secondary windings to the inductor's windings, as is known to those of skill in the art. As such, the constant may need to account for a voltage conversion factor. The same may be true for the current measuring module 332, in which case a current conversion factor would be needed. In addition, where an average power is being reported, the voltage and current values may be converted first to RMS (using the square root of two, as is well-known to those in the art), which can also be accounted for in the constant.

The power measurement module 334 sends the result of the multiplication, which will be a calculated power value, to the power monitoring module 346. The power monitoring module 346 presents data regarding power usage to a user in a meaningful way. For example, the power monitoring module 346 may save discrete calculated power values in a data set and present that information to a user upon request. It may also be configured to present a graphical representation of power usage to a user via a display.

Figure 4:
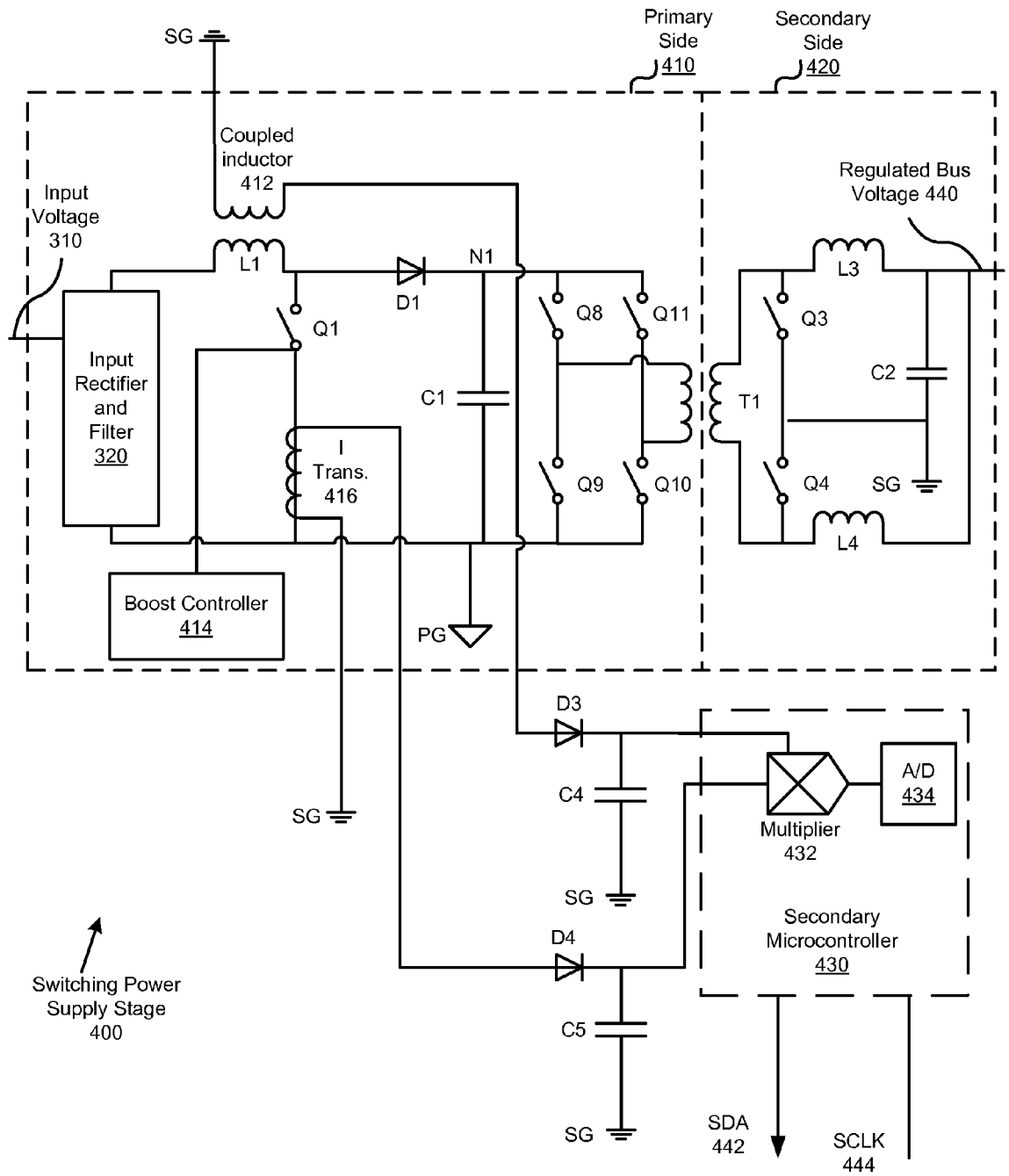
FIG. 4 is a schematic circuit diagram illustrating one embodiment of a switching power supply stage in accordance with the present invention.

FIG. 4 is one example of a topology for a switching power supply stage 400 in which the present invention may be applied. The switching power supply stage 400 comprises a primary side 410 and a secondary side 420. The switching power supply stage 400 receives an input voltage 310 which is passed through the input rectifier and filter 320. Those of skill in the art, however, will recognize that the present invention could be implemented in another switching power supply stage 400 with a different input.

The primary side is in a boost configuration which will generate a boosted voltage at the N1 node. In one embodiment, the boost stage boosts the voltage such that the boosted voltage at N1 is 400V. A transformer T1 couples the primary stage 410 and secondary stage 420, allowing energy to transfer from one side to the other. T1 acts as the input to the secondary stage 420. The secondary side 420 provides a regulated bus voltage 440 at its output. In one embodiment, the regulated bus voltage 440 is 12V DC.

The switching power supply stage 400 shown may provide active power factor correction for the power supply 300. As is known to those in the art, electrical loads using an AC current require both real and reactive power, the combination of which constitutes the apparent power. However, the reactive power is simply returned to the source. The real power divided by the apparent power is the power factor. A power factor approximately equal to one is highly desirable, and in many cases, required by regulations. The boost configuration shown on the primary side 410 in FIG. 4 draws a current approximately in phase with the input voltage to the boost stage, providing a power factor approximately equal to 1.

The primary side of the switching power supply stage 400 includes a number of switches, Q1, Q8, Q9, Q11, and Q10. These switches are typically semiconducting devices known to those of skill in the art and may be, for example, metal-oxide-semiconductor field-effect transistors (MOSFETs) or bipolar junction transistors (BJTs). Typical embodiments use power MOSFETs for the switches because of their high commutation speed and high efficiency at low voltages; however, a circuit may make use of other switching devices. As is known to those of skill in the art, the switches can be turned on (closed) and off (open) by changing the voltage at the MOSFET terminals. In a switching power supply stage 400, the switches are turned off and on at a high frequency with respect to the frequency of the input signal. For example, a switching rate in a typical switching power supply stage 400 may be approximately 100 kHz.

Also shown is a boost controller 414, which includes a pulse-width modulator. The boost controller 414 controls the switching rate of the switch Q1. Although not shown, those of skill in the art will recognize that the boost controller 414 or other boost controllers will control the switching rates of the remaining primary switches Q8, Q9, Q10, and Q11 and the secondary switches Q3 and Q4. The boost controller 414 uses a duty cycle value between 0 and 1 to specify a portion of the switching period in which the switch Q1 is in on. The voltage at N1 is raised and lowered by changing the duty cycle value and/or the switching period used by the boost controller 414. A feedback signal is generally provided to the boost controller 414 from the node N1 to allow it to maintain a constant voltage at that location. In one embodiment, the boost controller 414 may send the signal to a driver (not shown) which converts the signal to one that is compatible with the particular switch receiving the signal from the boost controller 414.

In the depicted embodiment, the voltage measuring module 330 is implemented with a coupled inductor 412 connected in series with a voltage bleed diode D3. The coupled inductor 412 and voltage bleed diode D3 are in parallel with a voltage measure capacitor C4. In one embodiment, the coupled inductor 412 is a secondary winding made up of a few turns wound around the existing inductor L1. This coupled inductor 412 provides a value proportionate to the voltage across the inductor L1. The proportionality constant is based on the ratio of the turns on L1 and the turns of the coupled inductor 412. Determination of a proper voltage conversion factor needed to scale the sample to the actual voltage based on the ratio of turns is well known to those of skill in the art.

In this particular topology, when the switch Q1 is on, the voltage across the inductor L1 is proportionate to the voltage at the input to the boost stage. As such, in this case, the power measurement point is located at the input following the input rectifier and filter 320. L1 looks like the input voltage, minus the voltage dropped across the switch Q1. The minor inaccuracy due to the voltage drop across the switch generally introduces less than a 0.5% error, which is small enough to be ignored in most applications.

The voltage bleed diode D3 and voltage measure capacitor C4, connected to the coupled inductor 412, act as a peak detection circuit and capture the peak value of the voltage. Those of skill in the art will recognize that a variety of peak detection circuits are possible and may be implemented in the place of the particular detection circuit without departing from the essence of the present invention.

In addition, the voltage measuring module 330, here shown implemented using the coupled inductor 412, the voltage bleed diode D3, and the voltage measure capacitor C4, is coupled to the secondary ground SG. As a result, the voltage measurement module 330 is given the necessary electric isolation from the primary side without the need for the various A/D converters and opto-couplers used in the prior art. As such, there is a significant reduction in the cost necessary (about $3.00 to $5.00 per unit) by not spending money on measuring on the primary side 410 and subsequently transferring the measured values to the secondary side 420.

A similar circuit is shown implementing the current measuring module 332. The current measuring module 332 shown comprises the current transformer 416 in series with the current bleed diode D4, the series connection in parallel with a current measure capacitor C5. The current measuring module 332 is similarly grounded to the secondary ground SG to provide isolation from the primary side 410. And as above, the peak current is detected when the switch Q1 is closed.

Those of skill in the art will recognize that a current transformer 416 provides a current in the secondary winding proportional to the current in the primary. In one embodiment, the current transformer 416 is a standard toroid current transformer with the wire connecting the switch Q1 to the primary ground PG running through the center of the toroid. The wire running through the toroid is treated as a single primary winding, and the toroid may comprise an additional two-hundred turns about it constituting the secondary winding. The current transformer 416 detects the peak current in the switching power supply stage 400.

Those of skill in the art will appreciate that the current transformer 416 could be moved to other locations and still detect the peak current. For example, the current transformer may be located just before the inductor L1, or just before the diode D1, and still receive the peak value. Similar to the voltage measuring module 330, the peak value is held by the current measure capacitor C4.

In both the voltage measuring module 330 and the current measuring module 332, the respective capacitors C4 and C5 must be sized appropriately. Generally, the switching frequency is much greater than the frequency of the relevant voltage and current signals. As discussed above, the switching frequency is approximately 100 kHz, in contrast to the much slower 60 Hz frequency of the incoming voltage and current. As such, typically the capacitors C4 and C5 should be sized relative to the voltage and current frequency as opposed to the switching frequency. The capacitors C4 and C5 typically should be sufficiently large to hold a relatively constant value with respect to the input voltage and current frequency so that a peak value is tracked. As a result, changes in the peak input voltage and current are reflected over a few cycles of the Input Voltage 310 and the changes due to the switching are largely suppressed.

For example, for a typical Input Voltage 310 waveform for a 120 Vrms source, a rectified voltage from the Input Rectifier and Filter 320 will vary between about zero volts and a peak voltage of about 170 V over a 60 Hz cycle. Meanwhile, the switched voltage waveform measured across the inductor L1 will vary between about zero volts and the rectified voltage waveform at the instant the switch Q1 is closed. For example, during switching period when the rectified voltage waveform has risen only to 40 V, the peak voltage for one switching cycle may only be 40 V. The peak voltage capacitor C4 is intended to track a peak voltage over a 60 Hz cycle, not a switching cycle. The peak voltage capacitor C4 should track variations from a nominal 170 V for a typical 120 Vrms source and not for variations over a 100 kHz switching period. Therefore, the peak voltage capacitor C4 is typically sized to vary over a small number of 60 Hz cycles. The peak current capacitor C5 is sized in a similar way.

Peak voltages and currents may be detected with other topologies as well; for example, in a buck topology, the voltage measuring module 330 may again detect a peak voltage across the inductor for that configuration for a portion of the switching period. The current measuring module 332 may similarly be located at a variety of locations in the circuit. However, unlike with the above-described boost configuration, in a buck the relevant time period is while the switch is in an open position.

FIG. 4 also shows a secondary microcontroller 430 comprising a multiplier 432 and an analog-to digital converter ("A/D") 434. The multiplier receives as inputs the peak voltage value and the peak current value from the voltage measure capacitor C4 and the current measure capacitor C5 respectively. The secondary microcontroller 430 may further comprise a register (not shown) containing the constant value. The multiplier 432 multiplies the peak voltage with the peak current and the constant and passes the output to the A/D 434. Those of skill in the art will recognize that a variety of multiplier devices may be used to multiply the three values together.

The secondary microcontroller 430 provides a digital output power measurement substantially equal to the power at the power measurement point which, for the example of FIG. 4, is at the input to the primary side 410. This calculated power measurement may be provided to a power measurement module through a communications bus. For example, the communications bus may be an I²C bus with a serial data address (SDA) line 442 and serial clock (SCLK) 444. The present invention is not, however, limited to any particular communications bus such as I²C. For example, the present invention could be implemented using serial peripheral interface bus (SPI).

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 5:
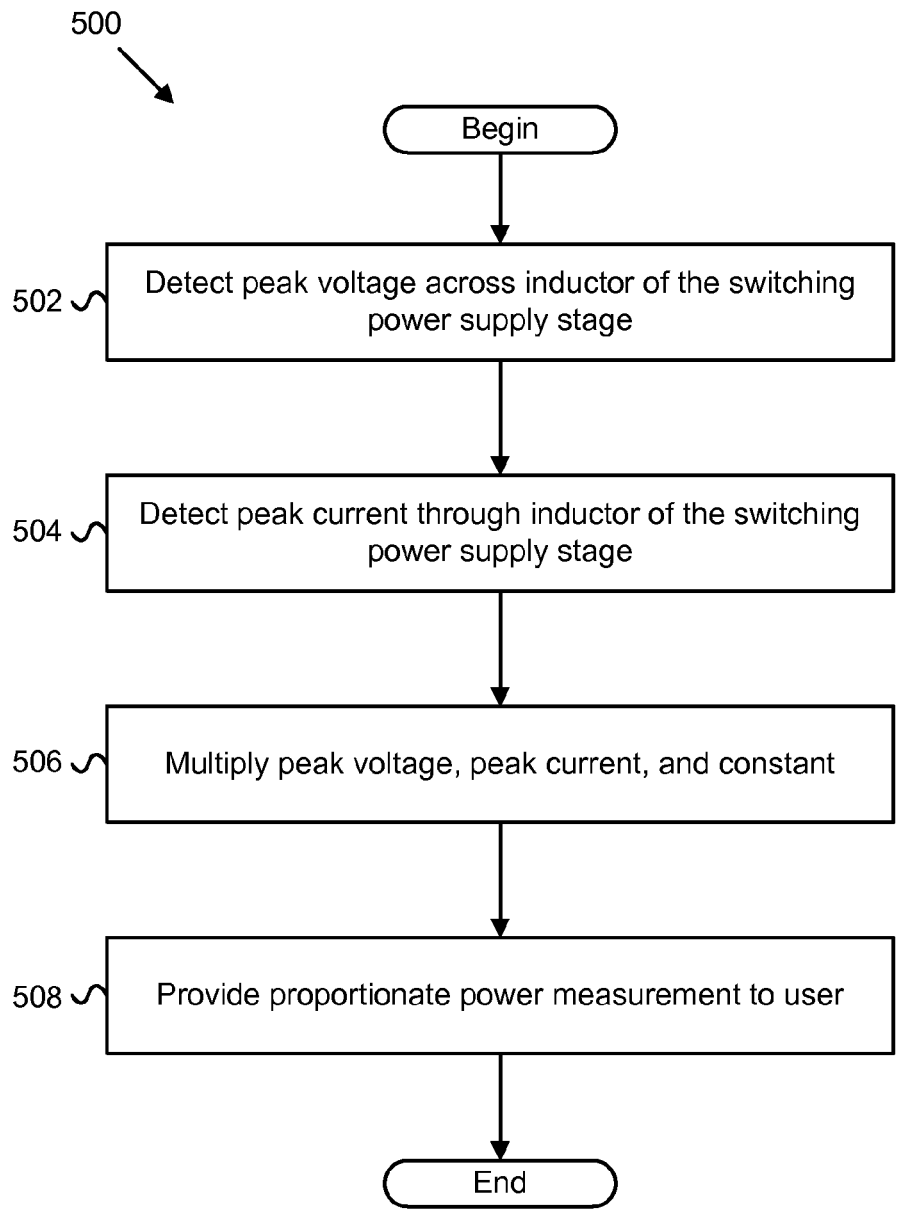
FIG. 5 is a schematic flow chart diagram illustrating one embodiment of a method for measuring power in accordance with the present invention.

FIG. 5 shows a method 500 for measuring input voltage, input current, and input power to a power supply. The method 500 begins with the voltage measuring module 330 detecting 502 a peak voltage across an inductor of the switching power supply stage 322$a$-$n$ for at least a portion of the switching period of the switching power supply stage 322$a$-$n$. As discussed above, the voltage across the inductor is substantially proportional to a voltage at a desired power measurement point in the switching power supply 322$a$-$n$.

The current measuring module 332 then detects 502 a peak current in the switching power supply stage 322$a$-$n$ for at least a portion of the switching period of the switching power supply stage 322$a$-$n$. The peak current is proportional to the current at the desired power measurement point in the switching power supply 322$a$-$n$.

The power measurement module 334 multiplies 506 the peak voltage and peak current, measured above, along with a constant to obtain a proportionate power value. In one embodiment, the constant is given an initial default value that based on an approximation of what the actual constant value should be. For example, a designer may initially know the number of turns on the secondary winding of the coupled inductor 412 and the current transformer 416, and may also have a good approximation of the losses that need to be accounted for in the constant. The constant may be given an initial value taking these various considerations into account, with the understanding that the constant will be given a more precise value through calibration at a later point as described in FIG. 6.

The proportionate power value is approximately equal to the actual power value measured at the desired power measurement point; ideally, there is less than a 1% error between the proportionate power value and the actual power value at the power measurement point. The power measurement module 334 then provides 508 this proportionate power measurement to a user, and the method ends.

Figure 6:
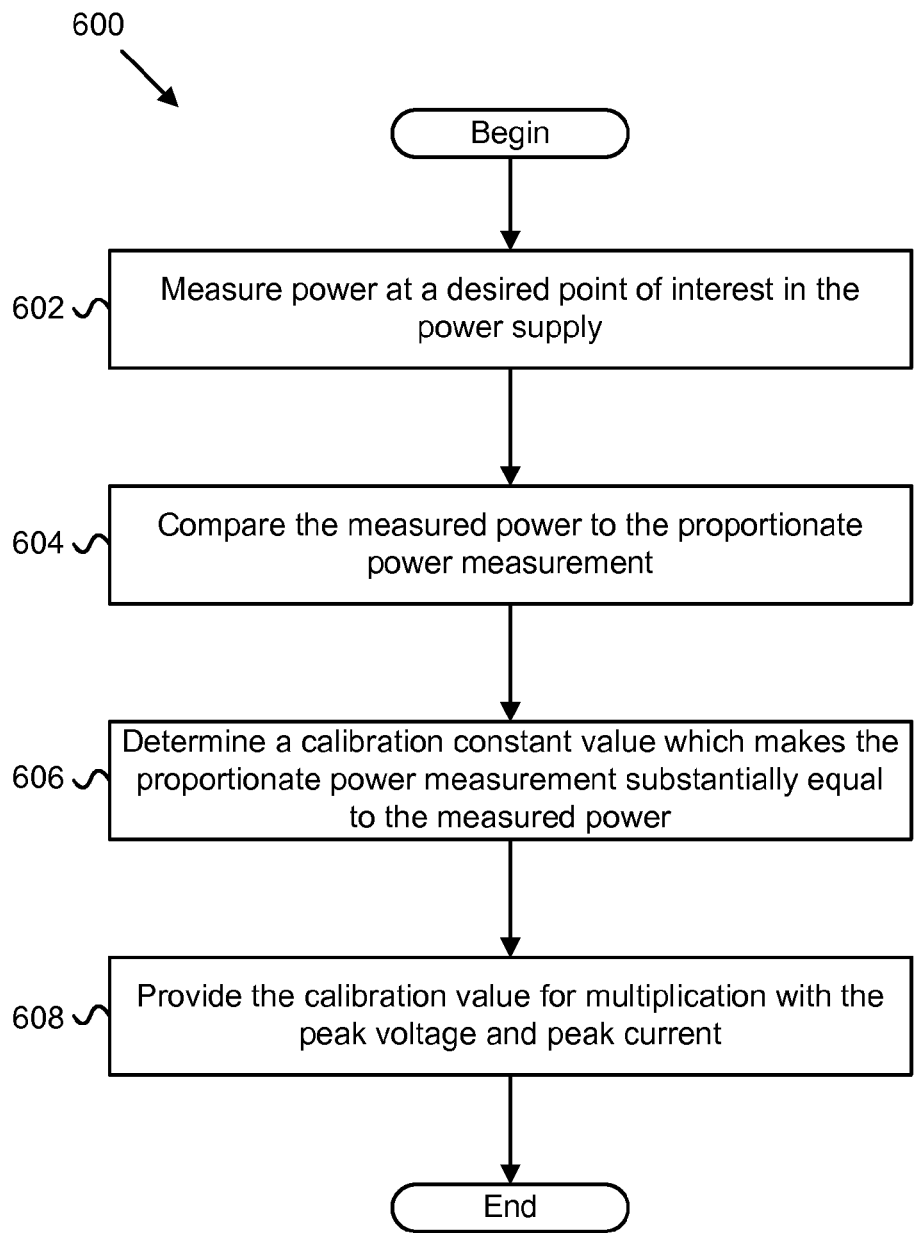
FIG. 6 is a schematic flow chart diagram illustrating one embodiment of a method for determining a calibration value in accordance with the present invention.

FIG. 6 shows a method for determining an appropriate constant value for use in determining the proportionate power value described in connection with FIG. 5. The method 600 involves measuring 602 the actual power at the power measurement point. Means for measuring power at a pair of terminals are well-known to those in the art. The actual power measured at the power measurement point is then compared 604 to the proportionate power value calculated as explained in FIG. 5.

Based on this comparison, a calibration value can be determined 606 for the constant such that the actual power is substantially equal to the proportionate power value. Since the relationship between the actual power and the proportionate power measured is substantially linear for the affected range, a scalar constant with a proper value will ensure that the reported proportionate power is close to the actual power.

The method 600 also provides 608 the calibration value as part of the constant for multiplication with the peak voltage and peak current to generate the proportionate power value.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to measure voltage, current and power comprising:
   a switching power supply stage of a power supply comprising an inductor and a switching device;
   a voltage measuring module configured to detect a peak voltage across the inductor for at least a portion of a switching period of the switching power supply stage, the peak voltage measured across the inductor being substantially proportional to a voltage at a power measurement point, wherein the power measurement point is a location in the power supply where a power measurement is desired;
   a current measuring module configured to detect a peak current in the switching power supply stage for at least a portion of a switching period of the switching power supply stage, the peak current being substantially proportional to a current at the power measurement point;
   a power measurement module configured to multiply the peak voltage with the peak current and a constant to obtain a power measurement substantially equal to the power measurement at the power measurement point.

2. The apparatus of claim 1, wherein the constant comprises a combination of a calibration factor, an RMS conversion factor, a voltage conversion factor, and a current conversion factor.

3. The apparatus of claim 1, wherein the voltage measuring module is coupled to a secondary ground, and wherein the current measuring module is coupled to the secondary ground, the secondary ground being separate from a primary ground for the switching power supply stage and providing electrical isolation from a primary side of the switching power supply stage.

4. The apparatus of claim 3, wherein the secondary winding is in series with a voltage bleed diode, the secondary winding and voltage bleed diode in parallel with a voltage measure capacitor.

5. The apparatus of claim 1, wherein the portion of the switching period corresponds to the switching device being in one of a closed state and an open state.

6. The apparatus of claim 5, wherein the current transformer is in series with a current bleed diode, the current transformer and current bleed diode in parallel with a current measure capacitor.

7. The apparatus of claim 1, wherein the voltage measuring module comprises a secondary winding coupled with the inductor.

8. The apparatus of claim 1, wherein the current measuring module comprises a current transformer.

9. The apparatus of claim 1, wherein the power measurement point is one of a power supply input point, an intermediate point, and a power supply output point.

10. The apparatus of claim 1, wherein the switching power supply stage is an active power correction stage in boost configuration, the switching power supply stage providing harmonic filtering and approximately unity power factor.

11. The apparatus of claim 10, wherein the input to the switching power supply stage is provided by an input rectifier and filter.

12. The apparatus of claim 10, wherein the current measuring module is in series with the switching device.

13. The apparatus of claim 1, wherein the apparatus further comprises an analog-to-digital converter configured to receive a power value from the power measurement module, the analog-to-digital converter further configured to provide a digital power value to a power-monitoring module.

14. A system to measure voltage, current and power, the system comprising:
   one or more power supplies, at least one power supply comprising:
      a switching power supply stage comprising an inductor and a switching device;
      a voltage measuring module configured to detect a peak voltage across the inductor for at least a portion of a switching period of the switching power supply stage, the peak voltage measured across the inductor being substantially proportional to a voltage at a power measurement point, wherein the power measurement point is a location in the power supply where a power measurement is desired;
      a current measuring module configured to detect a peak current in the switching power supply stage for at least a portion of the switching period of the switching power supply stage, the peak current being substantially proportional to a current at the power measurement point;
      a power measurement module configured to multiply the peak voltage with the peak current and a constant to obtain a power measurement substantially equal to the power measurement at the power measurement point, wherein the result of the multiplication is a digital power value;
      a power monitoring module configured to receive the digital power value from the power measurement module and provide the digital power value to a user;
   an electronic device comprising the varying load to the one or more power supplies; and
   a regulated bus being connected between the electronic device and the one or more power supplies, wherein the regulated bus delivers power from the one or more power supplies to the electrical device.

15. The system of claim 14, wherein the voltage measuring module is coupled to a secondary ground, and wherein the current measuring module is coupled to the secondary ground, the secondary ground being separate from a primary ground for the switching power supply stage and providing electrical isolation from a primary side of the switching power supply stage.

16. The system of claim 14, wherein the electronic device comprises one of a personal computer, a laptop computer, and a server.

17. The system of claim 14, wherein the constant comprises a combination of a calibration factor, an RMS conversion factor, a voltage conversion factor, and a current conversion factor.

18. A method for measuring voltage, current and power, the method comprising:
   detecting a peak voltage across an inductor of a switching power supply stage in a power supply for at least a portion of the switching period of the switching power supply stage, the voltage across the peak inductor being substantially proportional to a voltage at a power measurement point, wherein the power measurement point is a location in the power supply where a power measurement is desired;

detecting a peak current in the switching power supply stage for at least a portion of the switching period of the switching power supply stage, the peak current being substantially proportional to a current at the power measurement point;

multiplying the peak voltage with the peak current and a constant, wherein the result of the multiplication represents a proportionate power value.

19. The method of claim 18, further comprising determining a calibration constant, determining the calibration constant further comprising:

measuring an actual power at the power measurement point;

comparing the actual power to the proportionate power value;

determining a calibration value for the constant such that the actual power is substantially equal to the proportionate power value; and providing the calibration value for multiplication with the peak voltage and the peak current.

20. The method of claim 18, further comprising providing the proportionate power value to a user.

* * * * *